United States Patent
Jansen et al.

(10) Patent No.: US 8,212,413 B2
(45) Date of Patent: Jul. 3, 2012

(54) CIRCUIT ASSEMBLY FOR GATING A POWER SEMICONDUCTOR SWITCH

(75) Inventors: Uwe Jansen, Wehrl (DE); Ulrich Schwarzer, Warstein (DE); Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 532 days.

(21) Appl. No.: 12/557,026

(22) Filed: Sep. 10, 2009

(65) Prior Publication Data

US 2010/0066175 A1 Mar. 18, 2010

(51) Int. Cl.
*H04B 15/00* (2006.01)
(52) U.S. Cl. ............................. 307/89; 307/91
(58) Field of Classification Search .................. 307/89, 307/91
See application file for complete search history.

(56) References Cited

U.S. PATENT DOCUMENTS 6,181,008 B1 * 1/2001 Avery et al. .................. 257/723
6,313,598 B1 11/2001 Tamba et al.

OTHER PUBLICATIONS

Office Action issued Nov. 20, 2009 in re: Application No. DE 10 2008 047 028.7-32.
Skibinski et al., "EMI Emissions of Modern PWM ac Drives," IEEE Industry Application Magazine, Nov./Dec. 1999, pp. 47-81, vol. 5, No. 6, IEEE Industry Application Society, Sarasota Springs, NY, US.

* cited by examiner

*Primary Examiner* — Hal Kaplan
(74) *Attorney, Agent, or Firm* — Murphy, Bilak & Homiller, PLLC

(57) ABSTRACT

An embodiment of the invention relates to a circuit assembly having the following components: a power transistor with a control terminal, a first load terminal and a second load terminal, the second load terminal having a floating potential; a driver circuit configured to generate control signals for the control terminal of the power transistor, the relevant reference potential for the driver circuit being the floating potential of the second load terminal; a planar metallization layer sited on or in a substrate and comprising a constant reference potential, a shielding plane isolated from the metallization layer, sited planar on or in the substrate such that it is capacitively coupled to the metallization layer; a power supply circuit for providing a supply voltage referenced to the floating potential of the second load terminal for the driver circuit, the power supply circuit comprising, circuited between the second load terminal and the shielding plane, a first series circuit including a first capacitor and a first diode.

13 Claims, 4 Drawing Sheets

CIRCUIT ASSEMBLY FOR GATING A POWER SEMICONDUCTOR SWITCH

PRIORITY CLAIM

The present application claims the benefit of German Patent Application No. 102008047028.7-32, filed Sep. 13, 2008, which is incorporated by reference herein in its entirety.

FIELD OF THE INVENTION

The invention relates to gating power semiconductor switches, more particularly to a circuit for powering driver circuits for power semiconductor switches.

BACKGROUND OF THE INVENTION

Voltage-controlled electronic power switches comprise two load electrodes—usually termed "source" and "drain" for a MOSFET, "emitter" and "collector" for an IGBT—between which the load current to be gated flows through a load path of the semiconductor switch (in other words the drain-source current path) as well as a gating electrode—usually termed "gate"—whose difference in potential to that of the load electrode, usually termed "source", is decisive as to whether the load path of the semiconductor switch is a high-impedance (OFF state of the switch) or low-impedance (ON state of the switch) or is in some state in between. When the reference potential of the gate electrode (in other words the potential of the source electrode) is floating, i.e., may vary referenced to the constant reference potential "GND" depending on the operating mode of the circuit, then the voltage supply of the driver circuit activating the gate electrode needs to be operated at this floating reference potential, as is the case, e.g., with high-side switches, i.e., switches circuited between an upper operating potential and the load.

In a half-bridge inverter consisting of the same type of voltage controlled electronic switches, two of these power switches are circuited in series between the poles of an operating voltage so that the source electrode of the first high-side power switch is connected to the drain electrode of the second low-side power switch in a common circuit node, the potential of which oscillates in time between the upper and lower limit of the operating voltage. This potential is the floating reference potential for the driver circuit gating the first (upper) power switch. The supply voltage of the driver circuit as the source for gating the first power switch needs to be correspondingly referenced also to the potential of this "floating" circuit node.

For this "floating" power supply of the driver circuits for bridge circuits in the voltage range above a 100 V intermediate circuit voltage and above a power of 0.5 kW use is made of either a bootstrap circuit or an isolated power supply, such as, e.g., switched power supplies or DC/DC converters.

In the bootstrap circuit a diode and capacitance are circuited in series with the load current branch of the power switch. When the power switch is OFF, the capacitance is charged, its voltage being tapped as the supply voltage for the driver circuit. The limits of the bootstrap circuit are dictated by a power switch when operated ON for a relatively long time. Since, during this time, the capacitance connected in parallel is only discharged, it is just a question of time until it is no longer able to satisfy its function of powering the driver circuit.

Isolated power supplies, for example transformers or isolated switched power supplies, are relatively complicated and expensive to achieve.

There is thus a need to provide a power supply circuit for driver circuits gating power semiconductor switches which is uncomplicated, achievable especially without having to use transformers and inductances and which can be integrated together with power semiconductors and drivers into an intelligent power module (IPM).

SUMMARY OF THE INVENTION

One example of the invention relates to a circuit assembly having the following components: a power transistor with a control terminal, a first load terminal and a second load terminal, the second load terminal having a floating potential; a driver circuit configured to generate control signals for the control terminal of the power transistor, the relevant reference potential for the driver circuit being the floating potential of the second load terminal; a planar metallization layer sited on or in a substrate and comprising a constant reference potential, a shielding plane isolated from the metallization layer, sited on or in the substrate such that it is capacitively coupled to the metallization layer; a power supply circuit for providing a supply voltage referenced to the floating potential of the second load terminal for the driver circuit, the power supply circuit comprising between the second load terminal and the shielding plane a first series circuit including a first capacitor and a first diode.

BRIEF DESCRIPTION OF THE DRAWINGS

The following figures and the further description are intended to make for a better understanding of the invention. It is understood that the elements in the figures are not necessarily to be appreciated as a limitation. Instead, the intention here is to illustrate the basics of the invention. In the figures, like parts are identified by like reference numerals.

DETAILED DESCRIPTION

Figure 2:
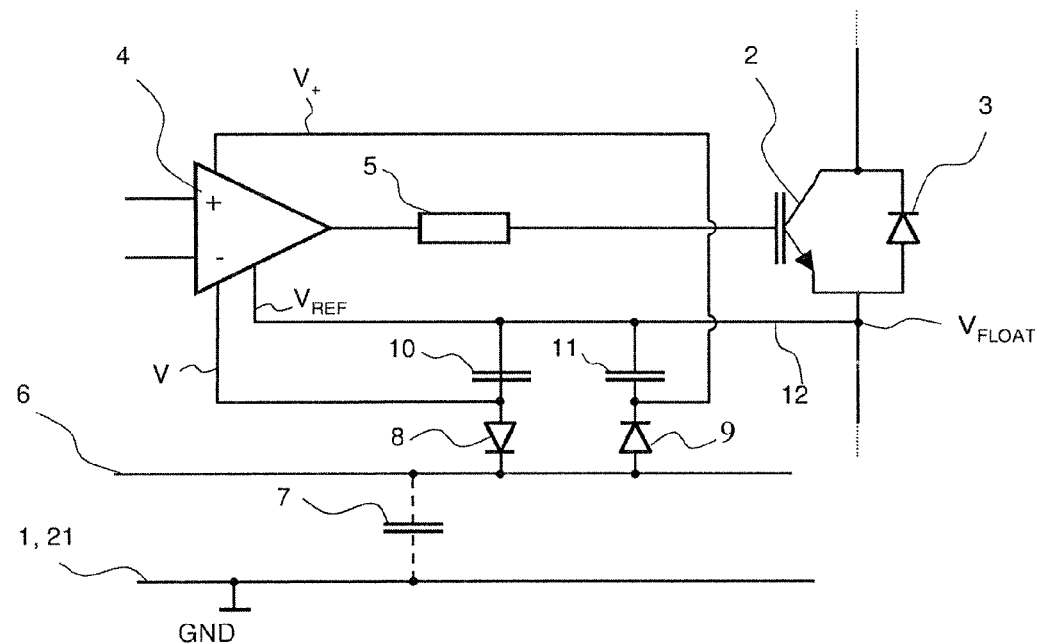
FIG. 2 is a circuit diagram of a first example of the circuit in accordance with the invention.

FIG. 2 shows one embodiment of the invention, an electrically conductive shielding plane 6 is circuited between parts of the circuit, whose reference potential voltage changes at high speed (high dV/dt) relative to GND, and an electrically conductive plane 1 or metallization layer 21 at GND potential from which the shielding plane 6 is electrically isolated. Leading from floating (VFLOAT) circuit nodes are two series circuits connected in parallel, each comprising a capacitance 10 or 11 and a diode 8 or 9, to the shielding plane 6, each of the two diodes 8 or 9 being sited at the shielding planes and oriented counter-opposed.

The potential at the junction between capacitance 10 and diode 8 or between capacitance 11 and diode 9 is supplied as a positive or negative supply voltage to the parts of the circuit working at the floating reference potential VFLOAT.

In one embodiment of the invention several floating reference potentials, each differingly referenced to the other, are in this way connected via two series circuits of a capacitance and diode to a common shielding plane.

In another embodiment of the invention, the potential of the shielding plane is tweaked specifically to charge the capacitances in the said series circuits.

In yet another embodiment of the invention, the floating reference potential relative to GND is the potential of an output of an inverter comprising getable electronic power switches, the potential tapped at each junction between a capacitance and a diode forming the corresponding positive or negative supply potential for the driver circuit of the electronic power semiconductor switch.

Various types of power transistors, particularly MOSFETs and IGBTs can be employed as power semiconductor switches.

Figure 1:
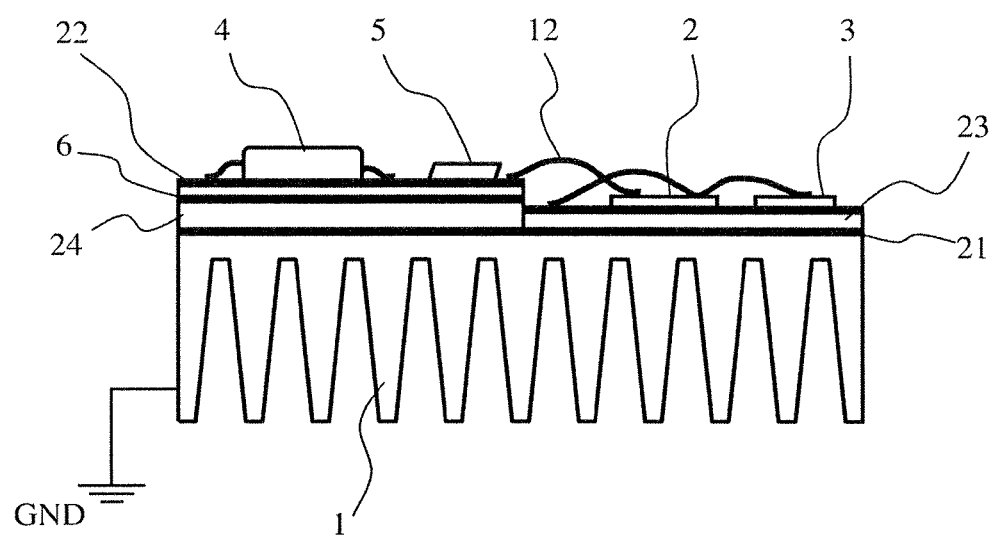
FIG. 1 is cross-sectional view of a first example of the circuit assembly in accordance with the invention.

Referring now to FIG. 1, there is illustrated the configuration of an intelligent power module (IPM) comprising a power circuit and driver circuit on a common heatsink 1. The heatsink 1 is typically engineered as a die-cast aluminum profile and is grounded, i.e., connected to GND potential for safety reasons and electromagnetic compatibility (EMC) considerations.

The heatsink 1 is electrically and conductively connected, e.g., by being imprinted, to a bottom metallization layer 21 of a substrate, e.g., a substrate 23 and/or a circuit board 24. In special instances the substrate may also be soldered to the heatsink, but many modules feature a backplane to which the substrate is soldered. In this case, the heatsink is imprinted on the backplane of the module using a heat-conductive paste. In the present example, this metallization layer 21 has no substantial electrical function.

The power electronic module mounted on the top of the substrate 23 (on the right in FIG. 1) comprises, e.g., at least one IGBT chip 2 and at least one diode chip 3 as a freerunning diode as well as bonds 12. The substrate 23 mounting the power electronic module has high thermal conductivity. The substrate 23 is typically a direct copper bonded (DCB) ceramic patterned with the necessary conductors.

The driver circuit (on the left in FIG. 1) is mounted on a multi-layer printed circuit board 24 as the substrate which achieves the necessarily high wiring density in the driver circuit while still adequately communicating heat to the heatsink.

A metallization layer 22 topping the multi-layer printed circuit board is patterned into electrical connections, i.e., the metallization layer 22 forms the conducting paths between the various components of the driver circuit. Shown by way of example in FIG. 1 are the driver circuit 4 and the gate resistance 5 as components of the driver circuit.

Interposed between the patterned top metallization layer 22 and the bottom metallization layer 21 is an electrically conductive inner planar metallization layer 6 acting as an isolating layer in each case. This inner metallization layer 6 represents a shielding plane the function of which is to avoid ill effects of the driver circuit, i.e., disturbances due to shifting currents as may be caused by the reference potential VFLOAT fluctuating relative to GND, and to improve the EMC of the assembly as a whole.

For this function, the inner metallization layer 6 is usually connected directly and electrically conductive to the reference potential of the driver circuit 4. But in the example of the invention as shown in FIG. 2 this connection is not made directly, but instead by two branches connected in parallel each comprising a diode 8, 9 and capacitance 10, 11 connected in series. Although this circuit tends to reduce the shielding effect, this is unsubstantial as compared to the major advantage of allowing the positive or negative supply potential for the driver circuit 4 to be tapped at the two junction nodes between the resistance 10, 11 and the diode 8, 9.

For a better appreciation of the assembly as shown in FIG. 1, the salient components of the circuit diagram read from FIG. 2. The source electrode of the voltage controlled electronic 2 (e.g., IGBT) is bonded 12 to an input of the driver circuit 4 (i.e., with the driver circuit) defining the reference potential thereof. The driver circuit 4 gates the semiconductor switch 2 via the resistance 5.

The bottom metallization layer 21 and the inner shielding plane 6 form together with an interposed isolating layer a (parasitic) capacitance 7. Currents flowing via this capacitance between GND potential and the inner layer 6 also flow—depending on the direction of flow—via each of the two capacitances 10, 11, charging them, making available a positive supply voltage V+ and a negative supply voltage V− at the capacitors 10 and 11 for the driver circuit 4. Each of these supply voltages V+ and V− for the driver circuit 4 is referenced to the floating potential VREF=VFLOAT.

The embodiment of a power supply shown in FIG. 2 provides a bipolar power supply for the driver circuit 4, i.e., a positive supply voltage V+ as referenced to the floating reference potential VREF and a negative supply voltage V− as referenced to the floating reference potential. However, in some cases also a unipolar power supply is sufficient, e.g., the positive supply voltage V+ as referenced to the reference potential VREF. In this case, as shown in FIG. 3 instead of the series circuit of the capacitor 10 and diode 8 as shown in the example of FIG. 2, just the diode 8 is provided as is necessary so that the charge communicated by a switching slope from the capacitor 7 to the capacitor 11 can flow back, without the capacitor 7 being discharged.

Figure 3:
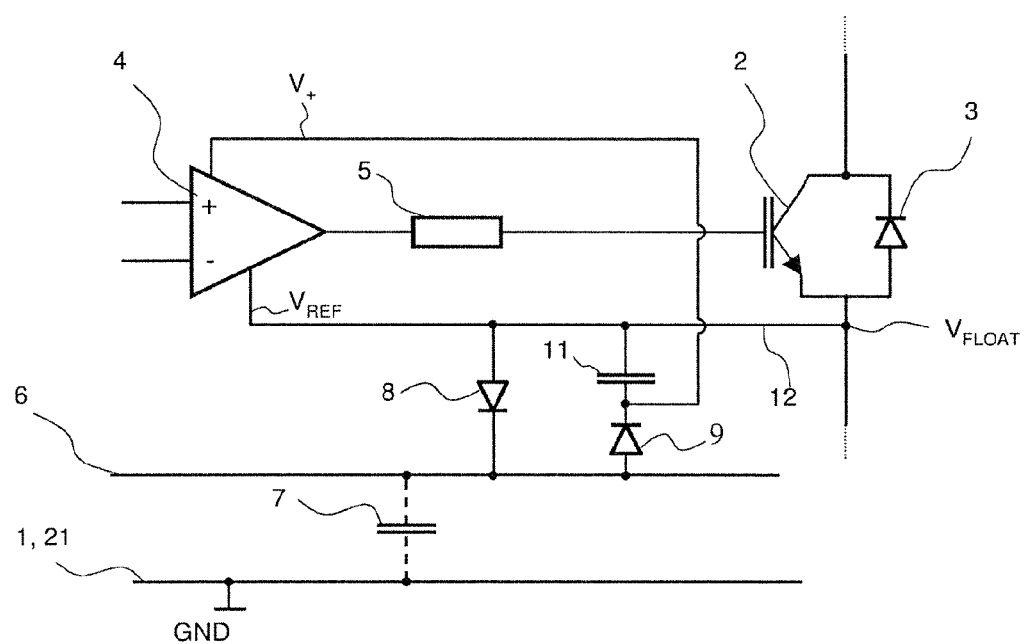
FIG. 3 is a circuit diagram of a further example of the circuit in accordance with the invention.

The switching actions as shown in FIGS. 2 and 3 are particularly expedient when several (high-side) power semiconductor switches are involved generating differing phases of the AC voltage and when all driver circuits of each power semiconductor switch are connected as shown by two diode-capacitor series circuits each to a sole common inner metallization 6. Then, irrespective of the parasitic capacitance 7 switching to a branch pair, results in the power supply being charged for the driver circuits of other power semiconductor switches. Such an assembly may be put to use, e.g., in a three-phase inverter for activating synchronous or asynchronous machines.

It is, of course, just as possible, even clever in some cases, to vary the potential of the shielding plane 6 by electronic switches gated separately to connect the shielding plane preferably via a corresponding further capacitance to the positive or negative general supply voltage or to GND to pass currents through the capacitances 10, 11 to charge them.

Figure 4:
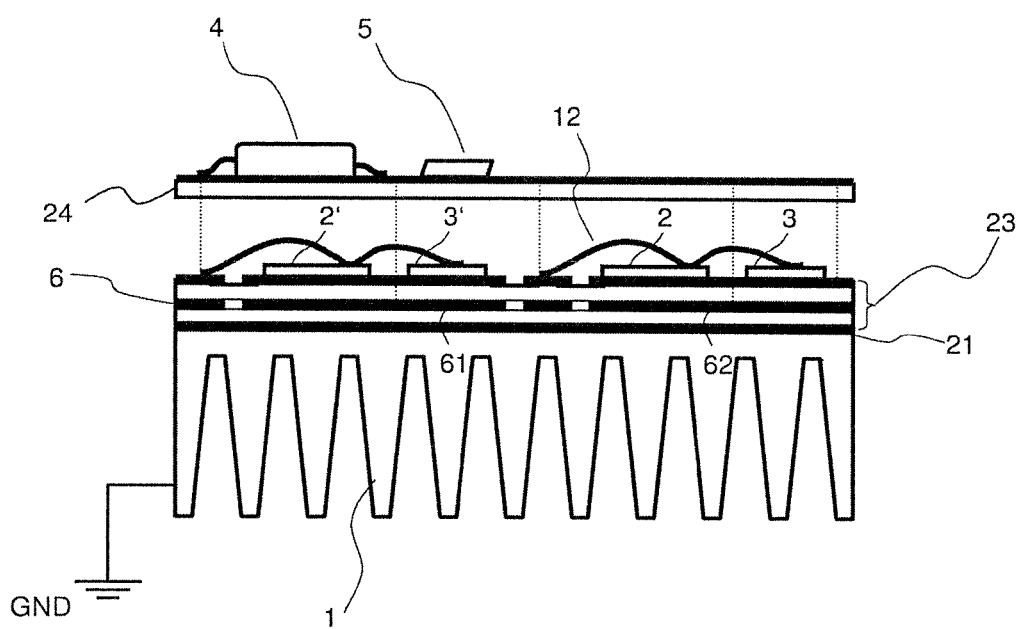
FIG. 4 is a cross-sectional view of a further example of the circuit assembly in accordance with the invention as shown in the circuit diagram of FIG. 2 or 3.

Referring now to FIG. 4, there is illustrated a further embodiment of a configuration in accordance with the invention of a power semiconductor module, depicted as an alternative to the example as shown in FIG. 1. Unlike the embodiment shown in FIG. 1, the printed circuit board 24 is here together with the substrate 23 (usually a ceramic substrate) mounting the power semiconductors (e.g., IGBT 2, diode 3) are not mounted on the heatsink. The heatsink is now simply mounted on the substrate 23 which can be configured as a multilayer substrate. The aforementioned inner metallization 6 (i.e., the shielding plane) forming together with the metallization 21 the parasitic capacitor 7 (see FIGS. 2 and 3) is now not sited in a multilayer printed circuit board but in the multilayer substrate mounting also the power semiconductor components 2, 3. In this arrangement, the printed circuit board 24 together with the driver circuit 4 can be sited with a small footprint on the substrate 23 in the semiconductor module. In FIG. 4, the electrical connections between the circuit board 24 and the substrate 23 are represented simply diagrammatically as dashed lines. When the substrate mounts a plurality of different switching power semiconductors (e.g., IGBTs 2 and 2'), the shielding plane 6 can be patterned so that counter-isolated portions 61, 62 are each sited below power semiconductor components having the same switching action. When the shielding plane 6 is unpatterned, the displacement currents of power transistors having different switching actions could cancel each other out, at least in part, so that the capacitors 10 and 11 (cf., FIG. 2) can no longer be adequately charged. When, as in the present case, the transistors 2 and 2' switch out of phase, the portion 61 of the shielding plane 6 must extend only under transistor 2' and the portion 62 only under the transistor 2. To each portion, a power semiconductor featuring capacitances 10, 11 and diodes 8, 9 can be connected, the same as shown in FIGS. 2 and 3 respectively.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A circuit assembly comprising:
   a power transistor with a control terminal, a first load terminal and a second load terminal, the second load terminal having a floating potential;
   a driver circuit configured to generate control signals for the control terminal of the power transistor, the relevant reference potential for the driver circuit being the floating potential of the second load terminal;
   a planar metallization layer sited on or in a substrate and comprising a constant reference potential,
   a shielding plane isolated from the metallization layer, sited on or in the substrate such that it is capacitively coupled to the metallization layer; and
   a power supply circuit for providing a supply voltage referenced to the floating potential of the second load terminal for the driver circuit, said power supply circuit comprising between the second load terminal and the shielding plane a first series circuit including a first capacitor and a first diode, and a second diode connected to said shielding plane.

2. The circuit assembly of claim 1 wherein said power supply circuit comprises a second series circuit including a second capacitor and the second diode connected between the second load terminal and the shielding plane, the anode of the first diode and the cathode of the second diode being connected to said shielding plane.

3. The circuit assembly of claim 2 wherein applied to the anode of the second diode is a, as referenced to the floating potential, negative supply potential for the driver circuit.

4. The circuit assembly as set forth in claim 1 wherein applied to the cathode of the first diode is a, as referenced to the floating potential, positive supply potential for the driver circuit.

5. The circuit assembly of claim 1 wherein said shielding plane is connectable via separate controllable electronic switches directly or indirectly to a positive or negative operating voltage or to GND potential.

6. The circuit assembly as set forth in claim 1, further comprising
   a further power transistor forming together with the power transistor a half-bridge, the second load terminal of the power transistor being connected to a first load terminal of said further power transistor.

7. The circuit assembly as set forth in claim 1 wherein the substrate is a multilayer printed circuit board mounting said driver circuit, or a ceramic substrate mounting said power transistor.

8. A power semiconductor module comprising
   a substrate;
   a power transistor mounted thereon with a control terminal and a first and second load terminal;
   a multilayer printed circuit board;
   a driver circuit mounted thereon for gating said power transistor;
   a planar metallization layer sited on said multilayer printed circuit board and/or substrate and comprising a constant ground potential;
   a shielding plane isolated from the constant ground potential and sited planar on or in the substrate and/or the multilayer printed circuit board such that it is capacitively coupled to said metallization layer; and
   a power supply circuit for providing a supply voltage referenced to the floating potential of the second load terminal for the driver circuit, said power supply circuit comprising a first series circuit circuited between the second load terminal and the shielding plane, said first series circuit including a first capacitor and a first diode, and comprising a second diode connected to said shielding plane.

9. The power semiconductor module of claim 8 wherein said power supply circuit comprises a second series circuit including a second capacitor and a second diode connected between the second load terminal and the shielding plane, the anode of the first diode and the cathode of the second diode being connected to said shielding plane.

10. The power semiconductor module of claim 8 wherein attached to the cathode of the first diode is a supply potential positively referenced to the floating potential for the driver circuit.

11. The power semiconductor module of claim 8 wherein said substrate and multilayer printed circuit board are juxtaposed and wherein said shielding plane is arranged in or on said multilayer printed circuit board.

12. The power semiconductor module of claim 8 wherein said substrate and multilayer printed circuit board are juxtaposed and wherein said shielding plane and metallization layer are arranged in or on said multilayer printed circuit board.

13. The power semiconductor module of claim 8 wherein said multilayer printed circuit board is arranged above the substrate and wherein said shielding plane and metallization layer are sited in the substrate configured as a multilayer substrate.

* * * * *